United States Patent [19]

Hayden et al.

[11] Patent Number: 5,040,309
[45] Date of Patent: Aug. 20, 1991

[54] DRILL COLLAR POSITION VERIFIER

[75] Inventors: Gary E. Hayden, Lombard; Thomas G. Wojciechowski, Oak Lawn; John B. Portzer, Elmhurst, all of Ill.

[73] Assignee: AG Communication Systems Corporation, Phoenix, Ariz.

[21] Appl. No.: 571,388

[22] Filed: Aug. 23, 1990

[51] Int. Cl.⁵ .............................. G01B 3/22
[52] U.S. Cl. ............................ 33/833; 340/686
[58] Field of Search ............ 340/686; 33/501.6, 636, 33/501.05, 1 L, 712, 832, 833, 836; 200/61.41; 408/16

[56] References Cited

U.S. PATENT DOCUMENTS 2,508,051  5/1950  Warren et al. ............... 33/501.6
4,749,858  6/1988  Young ............................ 33/833 X Primary Examiner—Jerry W. Myracle
Attorney, Agent, or Firm—Gregory G. Hendricks

[57] ABSTRACT

A drill collar position verifier is disclosed for use with a drill bit having a drilling depth control collar positioned coaxially thereon. The drill bit is inserted in a cylindrical opening in a plastic block to a depth determined by the position of the collar. A metallic foil and membrane switch are positioned below the plastic block of predetermined depth and are connected to logic circuitry which is further connected to LED indicators. If the drill bit does not protrude through the plastic block, an LED is lit to indicate that the collar is positioned too close to the tip of the drill bit. If the drill bit protrudes through the fixture and contacts the foil only, an LED is lit to indicate that the collar is positioned within tolerances. And, if the drill bit protrudes through the fixture and contacts both the foil and the membrane switch, an LED is lit to indicate that the collar is positioned too far away from the tip of the drill bit.

24 Claims, 1 Drawing Sheet

DRILL COLLAR POSITION VERIFIER

FIELD OF THE INVENTION

The present invention relates to test equipment and more particularly to a test set which determines the longitudinal positioning of a collar coaxially mounted on a drill bit is within predetermined tolerances.

BACKGROUND OF THE INVENTION

Numerical Control drilling machines used for the drilling of printed circuit boards (PCBs) hold very tight tolerances in the X, Y and Z axes. The means of controlling the Z-axis drill depth is to use a drill bit with a plastic collar which has been coaxially positioned on the drill bit a predetermined distance from the drill tip. If this distance is set incorrectly, the depth of the drilled holes becomes incorrect and the quality of the PCB deteriorates.

The plastic collar is positioned on the drill bit by means of a mechanical plunger mechanism. The drill bit is first inserted into a holder. The operator then applies a force to a lever to activate the plunger and slide the plastic collar to the desired position. The plunger mechanism is calibrated periodically to attempt to maintain the collar's position within allowed tolerances. However, once the collar is so positioned on the drill bit, there is no method available to periodically verify the validity of the collar's position.

Accordingly, it is the object of the present invention to provide a novel test device which can be utilized to verify the longitudinal position of a collar coaxially mounted on a drill bit.

SUMMARY OF THE INVENTION

In accordance with the present invention, a drill collar position verifier for use with a drill having a collar coaxially positioned thereon is disclosed. The drill collar position verifier includes a housing and a drill receptacle cavity formed in the housing and having a diameter greater than that of the drill but less than the outside diameter of the collar. The drill is inserted into the drill receptacle cavity until the collar contacts the housing, thereby restricting further insertion of the drill into the drill receptacle cavity, whereby the drill becomes seated.

Also included is a depth detector positioned within the housing and in close proximity to the seated drill and operated in response to the drill being seated to detect, and generate a first depth signal representative of, the positioning of the collar within a predetermined range of distances from the tip of the drill. It is further operated in response to the drill being seated to detect, and generate a second depth signal representative of, the positioning of the collar outside that predetermined range of distances.

Indicators are also included and they are mounted to the housing and connected to the depth detectors and operated in response to the first depth signal to generate and indicating signal of a first characteristic and further operated in response to the second depth signal to generate an indicating signal of a second characteristic.

DESCRIPTION OF THE PREFERRED EMBODIMENT

Figure 1:
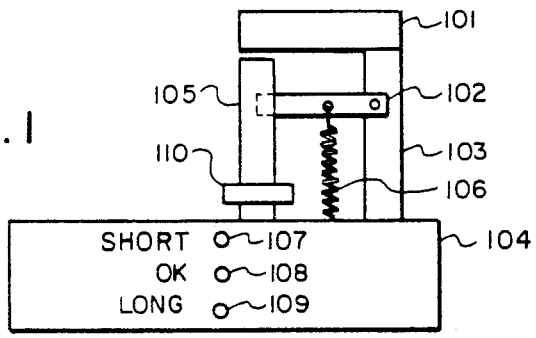
FIG. 1 of the accompanying drawing is a front view of the drill collar position verifier of the present invention.

Referring now to FIG. 1 of the accompanying drawing, a front view of the drill collar position verifier of the present invention is shown. Handle 101 and conductor 102 are connected to plunger shaft 103, which rises and descends in case 104, as does drill bit 105. Wire 106 provides an electrical connection between conductor 102 and the electrical circuitry within case 104. Light emitting diodes (LEDs) 107, 108 and 109 are mounted on case 104 and when turned on represent short, OK and long positions, respectively, of collar 110 relative to the tip of drill bit 105.

After collar 110 is affixed to drill bit 105 it is inserted into case 104. Handle 101 is then positioned above drill bit 105 and a downward force is then exerted on handle 105 causing plunger shaft 103 to be inserted into case 104 and collar 110 to be seated against case 104. Handle 101 and plunger shaft 103 are rotatable in case 104 and as the handle 104 is rotated into position above drill bit 105 conductor 102 is caused to come into contact with drill bit 105. Conductor 102 then completes an electrical path between drill bit 105 and the electrical circuitry in case 104 via wire 103.

Figure 2:
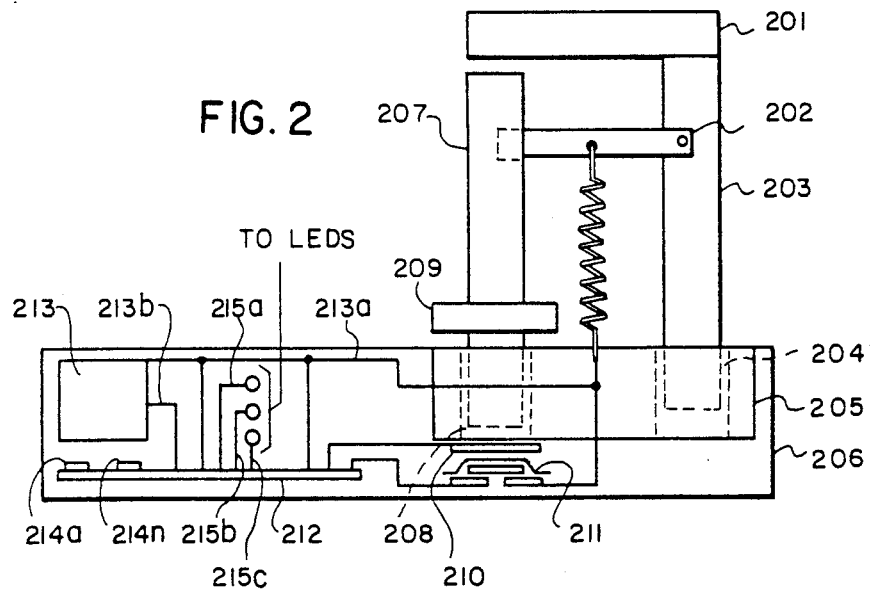
FIG. 2 of the accompanying drawing is a front view of the drill collar position verifier of the present invention with the front cover removed.

Referring now to FIG. 2 a front view of the drill collar position verifier of the present invention is shown with the front cover removed. Handle 201 and conductor 202 are connected to plunger shaft 203, which rises and descends in cavity 204 of plastic block 205, which is mounted to the top of case 206. Drill bit 207 is seated in cavity 208 of plastic block 205 when handle 201 is positioned above and pressed against the top of drill bit 206, thereby causing collar 209 to contact the top of case 206. Plastic block 204 is of a predetermined depth corresponding to the positioning of collar 209 on drill bit 207. Foil 210 is affixed to the bottom of plastic block 204 and membrane switch 211 is affixed to the bottom of foil 210. Foil 210 and membrane switch 211 are electrically connected to circuit board 212 by wires 210a and 211a, respectively. Membrane switch 211 is further connected to battery 213 and conductor 202 via ground wire 213a, which is also connected to circuit board 212. One or more integrated circuits 214a–214n are also connected to circuit board 212, as are output leads 215a–c which are further connected between integrated circuits 214a–n and LEDs 107–109, shown in FIG. 1. Battery 213 is further connected to circuit board 212 by power lead 213b, which, along with ground wire 213a, provide power and ground potentials to integrated circuits 214a–n.

To initiate the verification of the position of a drill collar, handle 201 is positioned above drill 207 causing conductor 202 to contact drill 207. Handle 201 is then deflected downward causing drill 207 and plunger shaft 203 to descend into cavities 208 and 204, respectively, of plastic block 205 until drill 207 becomes seated when collar 209 contacts the top of case 206.

When drill 201 becomes seated the tip of drill 201 extends into one of three positions relative to the bottom of plastic block 205, foil 210 and membrane switch 211. If the tip of drill 207 does not extend below the bottom of plastic block 205, it does not contact foil 210 and it does not depress membrane switch 211. In that case integrated circuits 214a-n interpret the signals from foil 10 and membrane switch 211 to indicate that collar 209 is positioned too low on drill 207 causing it to have an effective drilling depth that is too short. Accordingly, integrated circuits 214a-n cause the "Short" light, LED 107 (FIG. 1), to be lit.

If the tip of drill 207 extends below the bottom of plastic block 205, contacting foil 210 but not depressing membrane switch 211, integrated circuits 214a-n interpret the signals from foil 210 and membrane switch 211 to indicate that collar 209 is positioned within tolerances, causing drill 207 to have an effective drilling depth that is also within tolerances. Accordingly, integrated circuits 214a-n cause the "OK" light, LED 108 (FIG. 1), to be lit.

If the tip of drill 207 extends below the bottom of plastic block 205, contacting foil 210 and depressing membrane switch 211, integrated circuits 214a-n interpret the signals from foil 210 and membrane switch 211 to indicate that collar 209 is positioned too high on drill 207 causing it to have an effective drilling depth that is too long. Accordingly, integrated circuits 214a-n cause the "Long" light, LED 109 (FIG. 1), to be lit.

Figure 3:
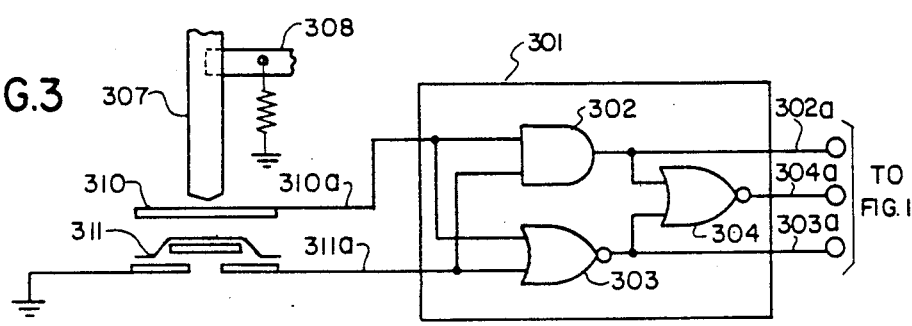
FIG. 3 of the accompanying drawing is a schematic diagram of the drill collar position verifier of the present invention.

Referring now to FIG. 3 a schematic diagram of the drill collar position verifier of the present invention is shown. Logic circuitry 301 includes AND gate 302 and NOR gate 303 whose outputs are connected to the inputs of NOR gate 304. The outputs of gates 302, 303 and 304 are connected via leads 302a, 303a and 304a to the "Short", "OK" and "Long" lights, LEDs 107, 108 and 109, respectively, of (FIG. 1). Membrane switch 311 is connected to gates 302 and 303 via lead 311a and foil 310 is connected to those gates via lead 310a. Membrane switch 311 is further connected to ground via lead 213a (FIG. 2) and foil 310 is connectable to ground via drill bit 307 and conductor 308. Logic circuitry 301 is packaged in integrated circuits 214a-n (FIG. 2).

When drill bit 307 is seated the tip of that drill bit extends to such a position as to: 1) not contact foil 310; 2) contact foil 310 but not depress membrane switch 311; or 3) contact foil 310 and depress membrane switch 311. If drill bit 307 does not extend to such a position as to contact foil 310 an open circuit condition is presented to AND gate 302 and NOR gate 303 via lead 310a. In this case membrane switch 311 is not depressed and an open circuit condition is also presented to those gates via lead 311a. Open circuit conditions on the inputs to logic gates are functionally equivalent to logic 1 conditions on those inputs. Consequently, logic 1 signals appear at both inputs to AND gate 302 causing it provides a logic 1 signal on its output lead 302a. Similarly, logic 1 signals appear at both inputs to NOR gate 303 causing it to provide a logic 0 signal on its output lead 303a. The logic 1 and logic 0 signals then appearing at the inputs of NOR gate 304 then cause it to provide a logic 0 signal on its output lead 304a. The logic 0 signals on leads 303a and 304a cause LEDs 108 and 109 (FIG. 2) to remain unlit while the logic 1 signal on lead cause LED 107 (FIG. 2) to become lit, thereby providing the "Short" drill bit indication, which identifies the collar as being positioned too close to the tip of the drill bit.

If drill bit 307 extends to such a position as to contact foil 310 but not depress membrane switch 311, then an open circuit condition continues to appear on lead 311a but a ground condition now appears on lead 310a via drill bit 307 and conductor 308. This ground condition appears as a logic 0 signal at the associated input to AND gate 302 and NOR gate 303. Consequently, logic 0 and 1 signals appear at the inputs to those gates causing them both to provide a logic 0 signal on their respective output leads, 302a and 303a. These logic 0 signals also appear at the inputs to NOR gate 304 causing it to provide a logic 1 signal on output lead 304a. Since logic 0 signals appear on leads 302a and 303a LEDs 107 and 109 (FIG. 2) are turned off. However, the logic 1 appearing on lead 304a causes LED 108 (FIG. 2) to become lit, thereby providing the "OK" indication which identifies the drill bit as being within tolerance.

If drill bit 307 extends to such a position as to contact foil 310 and depress membrane switch 311, then a ground condition appears on lead 310a via foil 310, drill bit 307 and conductor 308. A ground condition also appears on lead 311a via depressed membrane switch 311 which, when depressed, bridges lead 311a to ground. These ground conditions appear as logic 0 signals on leads 310a and 311a. Logic 0 signals then appear inputs to AND gate 302 causing it to provide a logic 0 signal on lead 302a. Similarly, logic 0 signals appear at both inputs to NOR gate 303 causing it to provide a logic 1 signal on lead 303a. These logic 0 and 1 signals on leads 302a and 303a, respectively, then appear at the inputs to NOR gate 304 causing it to provide a logic 0 signal on lead 304a. Since logic 0 signals appear on leads 302a and 304a, LEDs 107 and 108 (FIG. 2) are turned off. However, the logic 1 signal appearing on lead 303a causes LED 109 (FIG. 2) to be lit, thereby providing the "Long" indication which identifies the collar as being positioned too far away from the tip of the drill bit.

Other embodiments of the present invention would obviously include replacement of LED indicators with audible or other types of visual indicators. Similarly, the three LED version of the present invention could also be replaced with two or one light versions without departing from the spirit of the invention. For example, a two light version could be implemented with one light being lit for the "OK" indication and another for the "SHORT" and "LONG" indications. Such a multiple condition light could be connected to AND gate 302 and NOR gate 303 in a wired "OR" or logical "OR" arrangement. It could also be connected to NOR gate 304 via an inverter or it could be connected to a voltage source and be lit by a ground condition at the output of NOR gate 304. A one light version would merely be turned on and off by NOR gate 304 to provide the "OK" vs. "SHORT" or "LONG" indications.

Thus the drill position verifier of the present invention represents a novel structure for determining whether a collar is positioned coaxially along the shaft of a drill bit at a location within predetermined tolerances or whether the collar is positioned too close or too far from the tip of the drill bit.

It will be obvious to those skilled in the art that numerous modifications to the present invention can be made without departing from the spirit of the invention which shall be limited only by scope of the claims appended hereto.

What is claimed is:

1. A drill collar position verifier for use with a drill having a collar coaxially positioned thereon, said drill collar position verifier comprising:
   a housing;

a drill receptacle cavity formed in said housing and having a diameter greater than that of said drill but less than the outside diameter of said collar;

said drill being inserted into said drill receptacle cavity until said collar contacts said housing, thereby restricting further insertion of said drill into said drill receptacle cavity, whereby said drill becomes seated;

depth detection means positioned within said housing and in close proximity to said seated drill and operated in response to said drill being seated to detect, and generate a first depth signal representative of, the positioning of said collar within a predetermined range of distances from the tip of said drill, and further operated in response to said drill being seated to detect, and generate a second depth signal representative of, the positioning of said collar outside said predetermined range; and indicating means mounted to said housing and connected to said depth detection means and operated in response to said first depth signal to generate an indicating signal of a first characteristic and further operated in response to said second depth signal to generate an indicating signal of a second characteristic.

2. A drill collar position verifier as claimed in claim 1, wherein said drill receptacle cavity further comprises:

drill insertion guide means positioned within said housing and including a cylindrical cavity into which said drill is inserted.

3. A drill collar position verifier as claimed in claim 2, wherein said drill insertion guide means is formed from a plastic material.

4. A drill collar position verifier as claimed in claim 1, wherein there is further included:

plunger means; and a plunger cavity formed in said housing:

said plunger means comprising a shaft and a handle connected thereto and operated to cause said shaft to be inserted into said plunger cavity with said handle positioned above said drill, whereby said plunger means causes said drill to be inserted into said drill receptacle cavity until said collar contacts said housing, thereby restricting further insertion of said drill into said drill receptacle cavity and said shaft into said plunger cavity.

5. A drill collar position verifier as claimed in claim 4, wherein said plunger cavity further comprises:

plunger insertion guide means positioned within said housing and including a cylindrical cavity into which said shaft is inserted.

6. A drill collar position verifier as claimed in claim 5, wherein said plunger insertion guide means is formed from a plastic material.

7. A drill collar position verifier as claimed in claim 1, wherein said depth detection means comprises:

a first sensor operated in response to being physically contacted by said seated drill to generate a first sensor signal;

a second sensor positioned below said first sensor and operated in response to being physically contacted by said first sensor, to generate a second sensor signal; and logic means connected to said first and second depth sensors and operated in response to said first sensor signal and an absence of said second sensor signal to generate said first depth signal, and further operated in response to said first sensor signal and said second sensor signal to generate said second depth signal, and further operated in response to an absence of said first sensor signal and an absence of said second sensor signal to generate said second depth signal.

8. A drill collar position verifier as claimed in claim 7, wherein said first sensor comprises:

a metallic foil positioned below said drill receptacle cavity and an electrical conductor connected to ground and positioned against said drill, whereby said foil is connected to ground when said drill contacts said foil.

9. A drill collar position verifier as claimed in claim 7, wherein said second depth comprises:

a membrane switch connected to ground.

10. A drill collar position verifier as claimed in claim 7, wherein said logic means comprises:

an AND gate having a first input connected to said first sensor, and a second input connected to said second sensor;

a first NOR gate having a first input connected to said first sensor, and a second input connected to said second sensor; and a second NOR gate having a first input connected to the output of said AND gate, and a second input connected to the output of said first NOR gate, said second NOR gate being operated to provide said first and second depth signals.

11. A drill collar position verifier as claimed in claim 1, wherein said indicating means comprises a light emitting diode, which is turned on and off in response to said first and second depth signals, respectively.

12. A drill collar position verifier as claimed in claim 1, wherein said indicating means comprises first and second light emitting diodes, which are turned on and off in response to said first and second depth signals, respectively.

13. A drill collar position verifier for use with a drill having a collar coaxially positioned thereon, said drill collar position verifier comprising:

a housing;

a drill receptacle cavity formed in said housing and having a diameter greater than that of said drill but less than the outside diameter of said collar;

said drill being inserted into said drill receptacle cavity until said collar contacts said housing, thereby restricting further insertion of said drill into said cavity, whereby said drill becomes seated;

depth detection means positioned within said housing and in close proximity to said seated drill and operated in response to said drill being seated to detect, and generate a first depth signal representative of, the positioning of said collar within a predetermined range of distances from the tip of said drill, and further operated in response to said drill being seated to detect, and generate a second depth signal representative of, the positioning of said collar less than a predetermined range of distances from the tip of said drill, and further operated in response to said drill being seated to detect, and generate a third depth signal representative of, the positioning of said collar more than a predetermined range of distances from the tip of said drill; and indicating means mounted to said housing and connected to said depth detection means and operated in response to said first depth signal to generate an indicating signal of a first characteristic, and further operated in response to said second depth signal to generate an indicating signal of a second characteristic, and further operated in response to said third depth signal to generate an indicating signal of a third characteristic.

14. A drill collar position verifier as claimed in claim 13, wherein said drill receptacle cavity further comprises:
   drill insertion guide means positioned within said housing and including a cylindrical cavity into which said drill is inserted.

15. A drill collar position verifier as claimed in claim 14, wherein said drill insertion guide means is formed from a plastic material.

16. A drill collar position verifier as claimed in claim 13, wherein there is further included:
   plunger means; and
   a plunger cavity formed in said housing;
   said plunger means comprising a shaft and a handle connected thereto and operated to cause said shaft to be inserted into said plunger cavity with said handle positioned above said drill, whereby said plunger means causes said drill to be inserted into said drill receptacle cavity until said collar contacts said housing, thereby restricting further insertion of said drill into said drill receptacle cavity and said shaft into said plunger cavity.

17. A drill collar position verifier as claimed in claim 16, wherein said plunger cavity further comprises:
   plunger insertion guide means positioned within said housing and including a cylindrical cavity into which said shaft is inserted.

18. A drill collar position verifier as claimed in claim 17, wherein said plunger insertion guide means is formed from a plastic material.

19. A drill collar position verifier as claimed in claim 13, wherein said depth detection means comprises:
   a first sensor operated in response to being physically contacted by said seated drill to generate a first sensor signal;
   a second sensor positioned below said first sensor and operated in response to being physically contacted by said first sensor, to generate a second sensor signal; and
   logic means connected to said first and second sensors and operated in response to said first sensor signal and an absence of said second sensor signal to generate said first depth signal, and further operated in response to an absence of said first sensor signal and an absence of said second sensor signal to generate said second depth signal, and further operated in response to said first sensor signal and said second sensor signal to generate said third depth signal.

20. A drill collar position verifier as claimed in claim 19, wherein said first sensor comprises:
   a metallic foil positioned below said drill receptacle cavity and an electrical conductor connected to ground and positioned against said drill, whereby said foil is connected to ground when said drill contacts said foil.

21. A drill collar position verifier as claimed in claim 19, wherein said second sensor comprises:
   a membrane switch connected to ground.

22. A drill collar position verifier as claimed in claim 19, wherein said logic means comprises:
   an AND gate having a first input connected to said first sensor, and a second input connected to said second sensor;
   a first NOR gate having a first input connected to said first sensor, and a second input connected to said second sensor; and
   a second NOR gate having a first input connected to the output of said AND gate, and a second input connected to the output of said first NOR gate, said second NOR gate being operated to provide said first depth signal, said AND gate being operated to provide said second depth signal, and said first NOR gate being operated to provide said third depth signal.

23. A drill collar position verifier as claimed in claim 13, wherein said indicating means comprises first, second and third light emitting diodes, which are turned on in response to said first, second and third depth signals, respectively.

24. A drill collar position verifier for use with a drill having a collar coaxially positioned thereon, said drill collar position verifier comprising:
   a housing;
   a drill receptacle cavity formed in said housing and having a diameter greater than that of said drill but less than the outside diameter of said collar, said drill receptacle cavity comprising drill insertion guide means positioned within said housing and including a cylindrical drill cavity, said drill insertion guide means being formed from a plastic material;
   said drill being inserted into said drill receptacle cavity and said cylindrical drill cavity in said drill insertion guide means until said collar contacts said housing, thereby restricting further insertion of said drill into said cavity, whereby said drill becomes seated;
   a plunger cavity formed in said housing and comprising plunger insertion guide means positioned within said housing and including a cylindrical shaft cavity, said plunger insertion guide means being formed from a plastic material;
   plunger means comprising a shaft and a handle connected thereto and operated to cause said shaft to be inserted into said plunger cavity and said cylindrical shaft cavity with said handle positioned above said drill to be inserted into said drill receptacle cavity and said cylindrical drill cavity until said collar contacts said housing, thereby restricting further insertion of said drill into said drill receptacle cavity and said shaft into said plunger cavity;
   depth detection means positioned within said housing and in close proximity to said seated drill and operated in response to said drill being seated to detect, and generate a first depth signal representative of, the positioning of said collar within a predetermined range of distances from the tip of said drill, and further operated in response to said drill being seated to detect, and generate a second depth signal representative of, the positioning of said collar less than a predetermined range of distances from the tip of said drill, and further operated in response to said drill being seated to detect, and generate a third depth signal representative of, the positioning of said collar more than a predetermined range of distances from the tip of said drill, said depth detection means comprising;
   a first sensor operated in response to being physically contacted by said seated drill to generate a first sensor signal, said first sensor comprising a metallic foil positioned below said drill receptacle cavity and an electrical conductor connected to ground and mounted to said plunger shaft and positioned against said drill when said handle is positioned above said drill, whereby said foil is connected to ground when said drill contacts said foil;

a second sensor positioned below said first sensor and operated in response to being physically contacted by said first sensor, to generate a second sensor signal, said second sensor comprising a membrane switch connected to ground; and logic means connected to said first and second sensors and operated in response to said first sensor signal and an absence of said second sensor signal to generate said first depth signal, and further operated in response to an absence of said first sensor signal and an absence of said second sensor signal to generate said second depth signal, and further operated in response to said first sensor signal and said second sensor signal to generate said third depth signal, said logic means comprising an AND gate having a first input connected to said first sensor and a second input connected to said second sensor, a first NOR gate having a first input connected to said first sensor and a second input connected to said second sensor, and a second NOR gate having a first input connected to the output of said AND gate and a second input connected to the output of said first NOR gate, said second NOR gate being operated to provide said first depth signal, said AND gate being operated to provide said second depth signal, and said first NOR gate being operated to provide said third depth signal; and indicating means mounted to said housing and connected to said depth detection means and operated in response to said first depth signal to generate an indicating signal of a first characteristic, and further operated in response to said second depth signal to generate an indicating signal of a second characteristic, and further operated in response to said third depth signal to generate an indicating signal of a third characteristic, said indicating means comprising first, second and third light emitting diodes, which are turned on in response to said first, second and third depth signals, respectively.

* * * * *